(12) United States Patent
Mo et al.

(10) Patent No.: US 11,374,588 B1
(45) Date of Patent: Jun. 28, 2022

(54) METHOD AND APPARATUS TO CORRECT ADC GAIN ERROR INDUCED FROM TEMPERATURE DRIFT

(71) Applicant: MACOM Technology Solutions Holdings, Inc., Lowell, MA (US)

(72) Inventors: Chi Mo, Lowell, MA (US); Donghai Wang, Lowell, MA (US); Quazi Ikram, Lowell, MA (US); Ahmad Yazdi, Lowell, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 17/236,827

(22) Filed: Apr. 21, 2021

(51) Int. Cl.
    *H03M 1/46*     (2006.01)
    *H03M 1/10*     (2006.01)
    *H03M 1/06*     (2006.01)
    *H03M 1/08*     (2006.01)

(52) U.S. Cl.
    CPC ......... *H03M 1/462* (2013.01); *H03M 1/0607* (2013.01); *H03M 1/089* (2013.01); *H03M 1/1009* (2013.01)

(58) Field of Classification Search
    CPC .... H03M 1/462; H03M 1/0607; H03M 1/089; H03M 1/1009
    USPC .......................................... 341/118, 155, 163
    See application file for complete search history.

(56) References Cited

U.S. PATENT DOCUMENTS 10,396,811 B1 * 8/2019 Rankin ............... H03M 1/1014

* cited by examiner

*Primary Examiner* — Khai M Nguyen
(74) *Attorney, Agent, or Firm* — Weide & Miller, Ltd.

(57) ABSTRACT

An analog to digital converter temperature compensation system comprising a comparator configured to compare an analog input signal to a compensated feedback signal and generate a comparator output. A SAR module processes the comparator output to generate a digital signal. A digital to analog converter, biased by a biasing signal having temperature change induced error, is configured to convert the digital signal to a feedback signal and a detector is configured to detect a signal that is proportional to temperature. A look-up table is configured to receive and convert the signal that is proportional to temperature to a compensation signal such that the compensation signal compensates for the temperature change induced error in the biasing signal. A summing node combines the feedback signal with the compensation signal to create a compensated feedback signal.

18 Claims, 6 Drawing Sheets

METHOD AND APPARATUS TO CORRECT ADC GAIN ERROR INDUCED FROM TEMPERATURE DRIFT

FIELD OF THE INVENTION

The innovation relates to correcting analog to digital converter (ADC) gain error and in particular to a method and apparatus for correct ADC gain error induced from temperature drift.

RELATED ART

In electrical circuit, temperature changes can undesirably change circuit operation resulting in an introduction of error in circuit or system output. One exemplary circuit that suffers from temperature induced error are analog to digital converter (ADC), which suffers from gain error. Gain error is defined as the difference between the nominal and actual gain points on the transfer function after the offset error has been corrected to zero. For an ADC, the gain point is the mid-step value when the digital output is full scale, and for a digital to analog converter (DAC) it is the step value when the digital input is full scale. This error represents a difference in the slope of the actual and ideal transfer functions, and as such, corresponds to the same percentage error in each step. The concept of gain error is known in the art and as such, is not discussed in detail herein.

Figure 1:
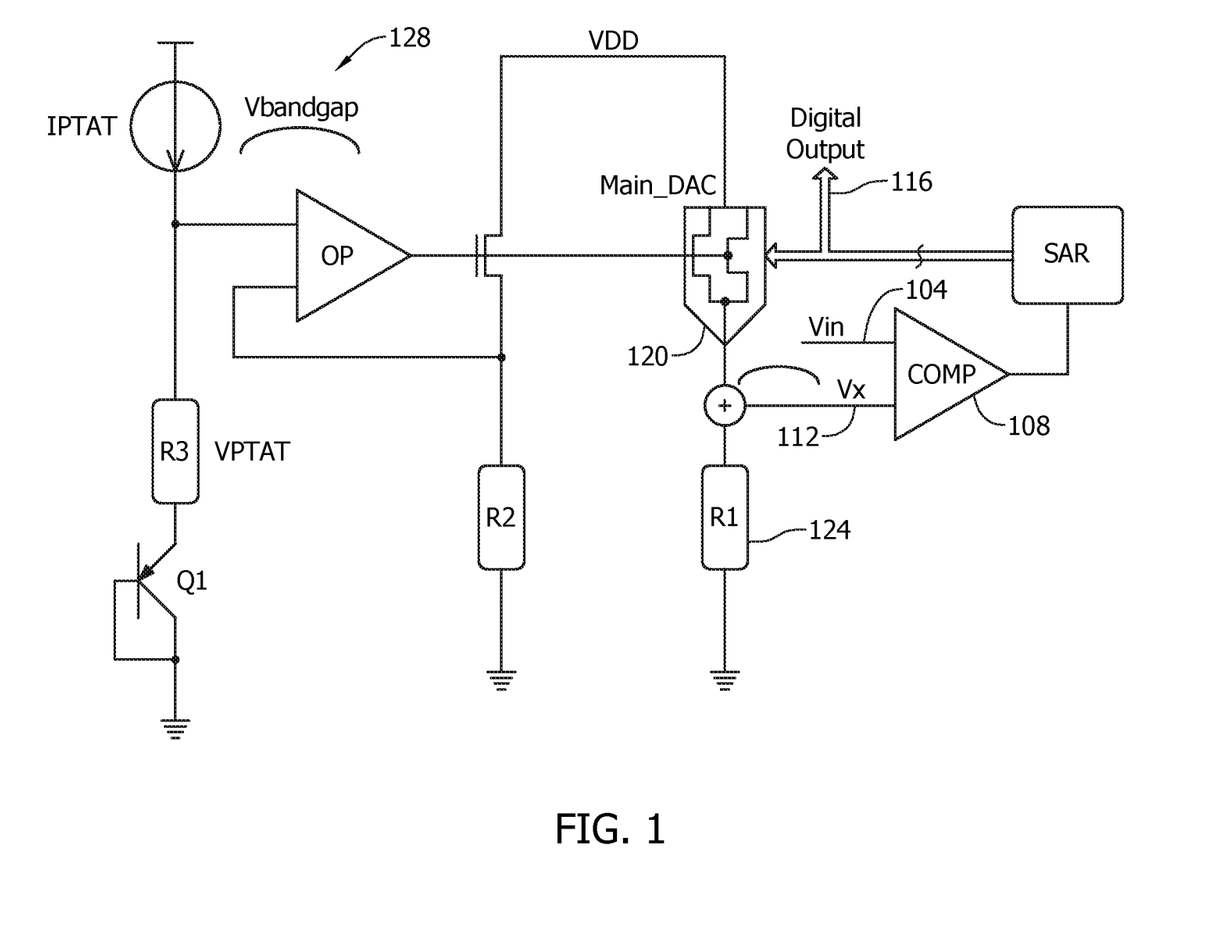
FIG. 1 illustrates an exemplary prior art ADC circuit.

FIG. 1 illustrates an exemplary prior art ADC circuit. As shown, an input 104 carries a signal Vin to a comparator 108. The signal Vin is the analog signal to be converted to a digital signal by the ADC circuit. The comparator 108 also receives a second input 112, that is a signal Vx, discussed below in more detail. The comparator compares the input Vin to the signal Vx and generates a difference signal as an output that is provided to a successive approximation registers (SAR) module 110 that processes the difference signal using successive approximations to generate a digital output signal on a digital output path 116, and the digital output signal is also provided as an input of a main DAC 120. The main DAC 120 converts a digital signal to an analog signal, which is then provided across resistor R1 124 to create the second input voltage Vx to the comparator 108.

The main DAC 120 is biased by a signal which is based on a Vbandgap voltage 128 which varies with temperature. This temperature induced bias variation affects the main DAC 120 causing it to have its output also vary with temperature, and thus, this affects the second input 112 to the comparator 108, thereby introducing temperature change induced ADC gain error. As is understood, this is undesirable and a drawback to prior art systems.

SUMMARY

To overcome the drawbacks of the prior art and provide additional benefits, disclosed is an analog to digital converter temperature compensation system comprising a comparator configured to compare an analog input signal to a compensated feedback signal and generate a comparator output. Also part of this embodiment is a SAR module configured to process the comparator output to generate a digital signal. A digital to analog converter, biased by a biasing signal having temperature change induced error or variation, is configured to convert the digital signal to a feedback signal. A detector is configured to detect a signal that is proportional to temperature and a look-up table is configured to receive and convert the signal that is proportional to temperature to a compensation signal such that the compensation signal compensates for the temperature change induced error in the biasing signal. A summing node is configured to combine the feedback signal with the compensation signal to create a compensated feedback signal.

In one embodiment, the bias signal is based on a bandgap voltage which varies over temperatures. The detector may comprise a voltage detector that detects a voltage that varies with a bandgap voltage. In one configuration, the system may further comprise a calibration digital to analog converter configured to convert the output of the look-up table to an analog format for summing with the feedback signal.

Also disclosed is a method for compensating gain error in an analog to digital converter comprising receiving an analog input signal for conversion to a digital signal, and processing the analog input signal and a compensated feedback signal to generate the digital signal such that as part of the processing, a feedback signal is created. Also part of this method of operation is detecting a temperature proportional voltage which varies proportionally to temperature and converts the proportional voltage to a compensation signal and combining the compensation signal with the feedback signal to generate a compensated feedback signal. The compensation signal reversing error in the feedback signal due to the feedback signal varying over temperature.

The step of converting comprises performing a look-up table indexing operation to retrieve a stored value that is correlated to the proportional voltage. This method of operation may occur in a SAR type ADC and the processing may further comprise comparing the compensated feedback signal to the analog input signal to generate an error signal and processing the error signal with a SAR module to generate the digital signal. It is contemplated that detecting a temperature proportional voltage may be performed by a voltage detector or any other device capable of detecting a voltage. In one embodiment, the feedback signal is influenced by a bandgap signal which varies over temperature. It is contemplated that the feedback signal may be generated by a main digital to analog converter. In addition, the main digital to analog converter may be biased by a bias signal that varies with temperature which introduces error into the feedback signal.

Also disclosed is a compensation system to correct error introduced in an analog to digital converter output caused by changes in temperature over time. In one embodiment, this system comprises a voltage detector configured to detect a temperature proportional voltage such that the temperature proportional voltage varies with temperature. Also part of this embodiment is a look-up table and a summing junction. The look-up table is configured to map the temperature proportional voltage to a compensation value and output the compensation value. The summing junction is configured to combine the compensation value with a feedback signal to thereby create a compensated comparator input to counter error in the comparator input.

This system may further comprise a comparator configured to compare the compensated comparator input to an analog input signal to the generate a comparator output and a SAR module configured to process the comparator output into a digital signal. It is also contemplated that the system may also include a main digital to analog converter configured to generate the feedback signal such that the main digital to analog converter also introduces error into the feedback signal due to temperature change induced error.

In one embodiment, the main digital to analog converter is biased by a bias signal, and the bias signal varies over temperature thereby introducing error into the feedback signal. This system may further comprise a compensation digital to analog converter configured to convert the compensation value from the look-up table to an analog format.

The voltage detector may be an analog voltage buffer and low accuracy temperature digitizer. The analog to digital converter may include a successive approximation register module.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 2:
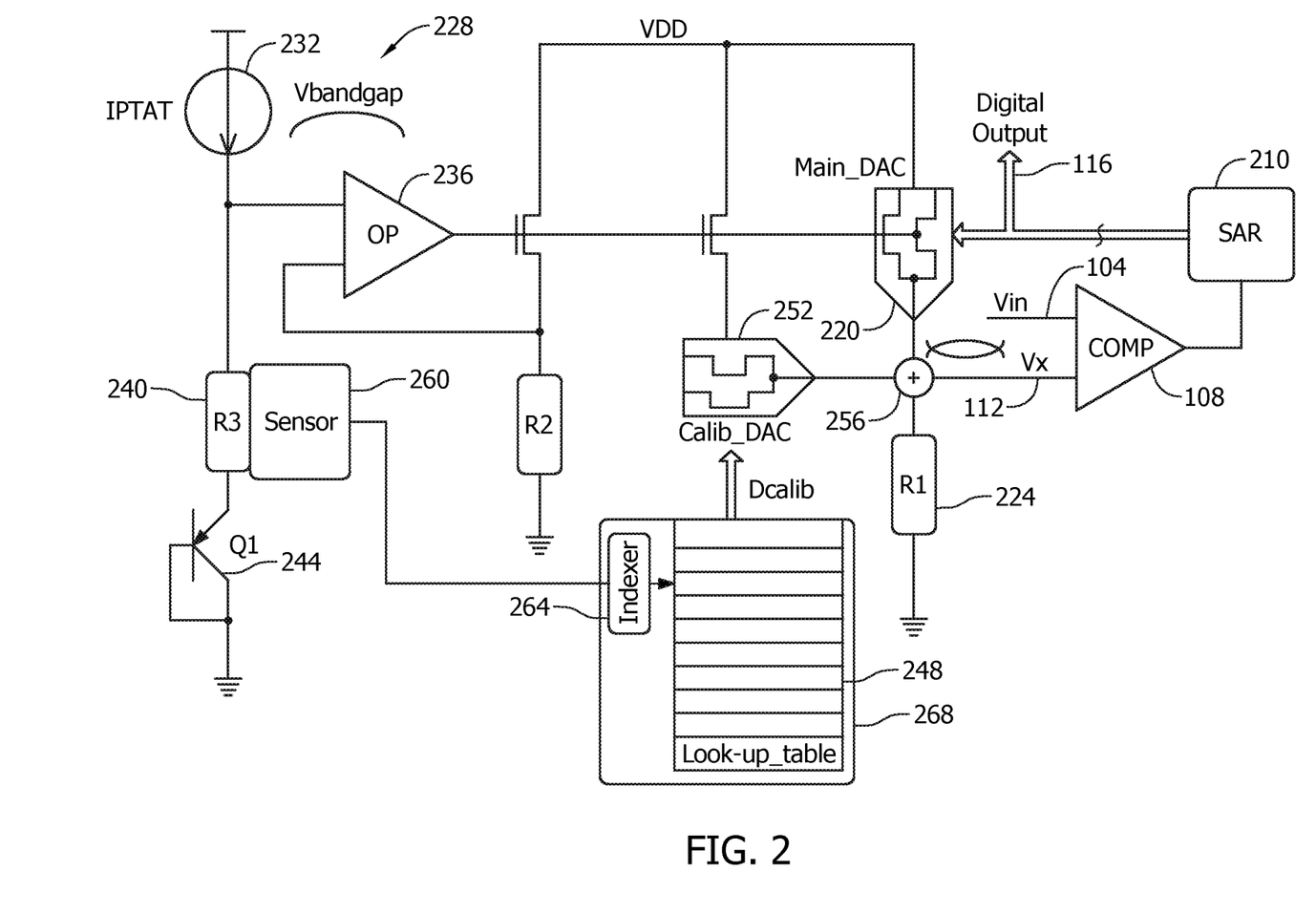
FIG. 2 illustrates a SAR ADC circuit with temperature compensation.

FIG. 2 illustrates an exemplary SAR ADC circuit with temperature compensation. As shown, an input 204 carries a signal Vin to a comparator 208. The comparator 208 also receives a second input 212, that is a signal Vx, discussed below in more detail. The comparator compares the input Vin to the signal Vx and generates a difference signal as an output that is provided to a successive approximation registers SAR module 210 that processes the difference signal using successive approximations to generate a digital signal output signal on a digital output path 216 and the digital output signal is also provided as an input of a main DAC 220. The main DAC 220 converts digital signal to an analog signal, which is provided across resistor R1 224 to create the comparator input voltage Vx on input 112.

The main DAC 220 is biased by a bias signal presented from an OP amp 236. The OP amp 236 output is based on a bandgap voltage Vbandgap 228. The OP amp 236 is configured to convert the voltage input to an output bias current which is fed into the main DAC. The bandgap voltage 228 is referenced from a current Iptat which is proportional to temperature and represented by current source 232 output flowing through a resistor R3 240 to create the bandgap voltage. The bandgap current is defined as follows:

$$Ibg=(Vbe+K*Vt)/R3$$

where K is a proportional ratio value selected and adjusted to cancel the variation in Vbe and Vt such that Vbe decreases with increasing temperature and Vt increases with increasing temperature. The transistor 240 creates a voltage Vbe Voltage Vt is a fixed voltage, in this embodiment 26 millivolts. The value of (Vbe+K*Vt) is generally constant over temperature in the first order, however at higher orders this value varies over temperature, thereby introducing error in the main DAC bias current.

To address the temperature variation induced error caused by the temperature varying bias signal for the main DAC 220, proposed is a temperature compensation system. The temperature compensation system includes a voltage sensor 260 (also referred to as a voltage detector) that monitors the voltage across resistor R3 240, which is referred to herein as the monitored temperature. Because the voltage across resistor R3 also varies with temperature, it provides a reliable indicator of the temperature induced variation occurring to the bias signal presented to the main DAC 220. The voltage sensor (detector) 260 may comprise any device able to detect the voltage across the resistor R3 240. In one embodiment the sensor 260 function is performed by an analog voltage buffer and low accuracy temperature digitizer.

Figure 3:
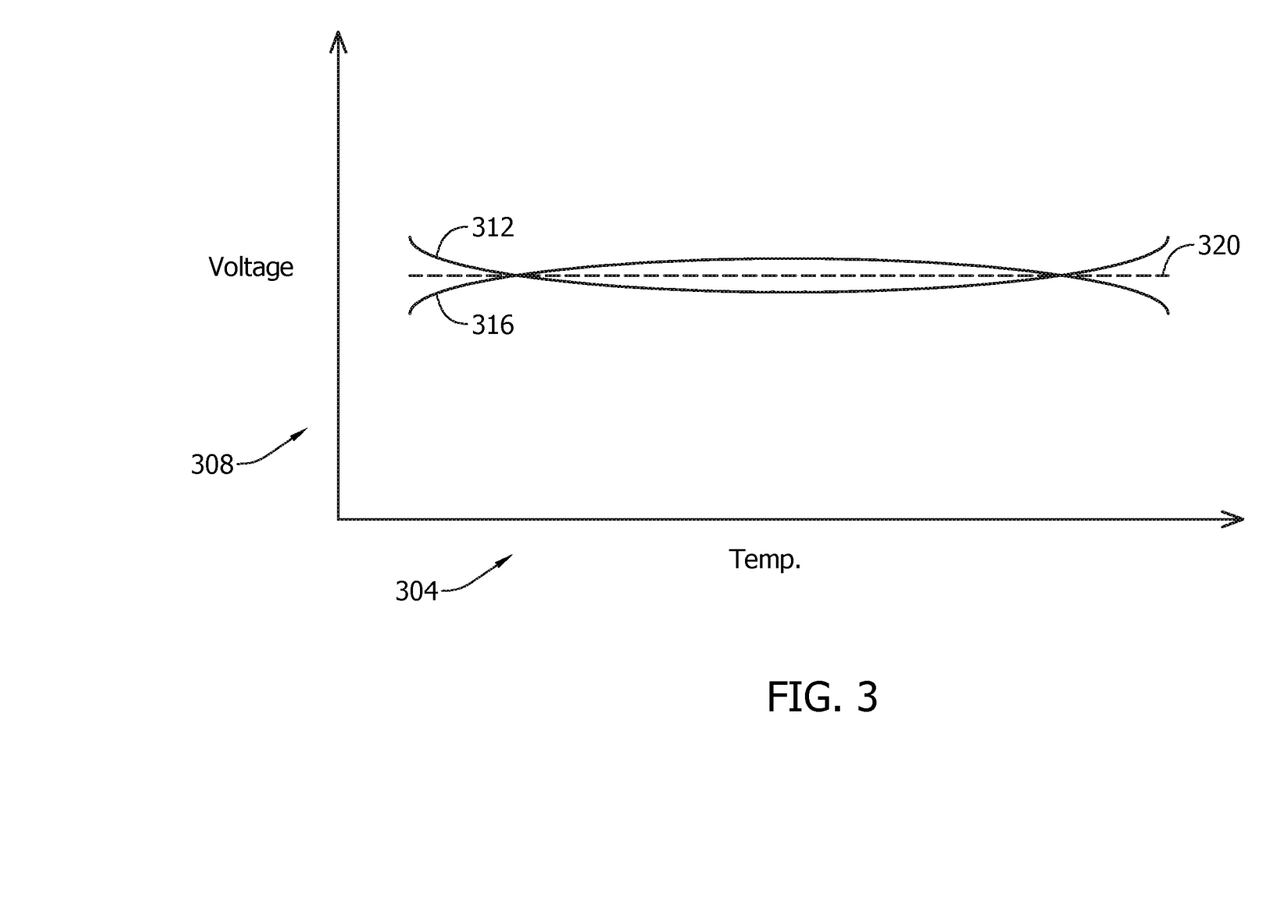
FIG. 3 which shows a plot of the main DAC output over temperature and the compensation value from the look-up table over temperature.

The sensed voltage from the sensor 260 is provided to an indexer 264 within a look-up table 268. The indexer matches the sensed voltage to an entry in memory 248 of the look-up table 268 to identify a corresponding compensation value. In this embodiment, the output of the look-up table 268 is a digital value. In one embodiment, the look up table contains 40 entries or steps corresponding to different values over a temperature range, such as in 3 or 4 degree steps. Thus, the input voltage is mapped into the look-up table to determine different output values. The output may vary non-linearly in relation to the input to create the precise output values to compensate for the error introduced in the main DAC output by the changes in the main DAC bias current over temperature. The resulting outputs, if plotted, would be inverse to the curve of the main DAC error. This is illustrated in FIG. 3.

The output from the look-up table 268 is presented to a calibration DAC 252 configured to convert the digital output from the look-up table to an analog format. The calibration DAC 252 is biased through PMOS device functioning as current mirror from a voltage source VDD. The output of the calibration DAC 252 is an analog signal that is provided to a summing junction 256 to be combined with the output of the main DAC 220. The resulting signal is a compensated Vx signal which is provided to the comparator 108.

The compensated Vx signal is no longer temperature dependent, thereby reducing or eliminating gain error in the digital signal presented on the ADC output 116.

Although shown with a look-up table 268, it is contemplated that devices other than look-up tables may be used, such as logic, DSP, software processing, ASIC, passive or active networks, or any other type system, may be used to generate the compensation signal. It is also contemplated that the compensation DAC 252 may be eliminated if the output of the compensation system is in an analog format.

It is contemplated that the input to the look-up table index 264 may not proportionally or linearly correspond to the required compensation value needed to compensate Vx over temperature. As a result, the look-up table stored values may non-linearly vary in relation to the input provided to the look-up table 268. This is better understood in reference to FIG. 3 which shows a plot of the main DAC ouput over temperature and the compensation value from the look-up table 268 over temperature. In FIG. 3, the horizontal axis 304 represents temperature while the vertical axis represents voltage. A plot 312 represents voltage Vx. Ideally, Vx plot 312 would be linear over temperature. However, as shown, it varies such that it increases in voltage at low temperatures and high temperatures as shown. This variation is for purposes of discussion and it is contemplated that in various different systems the temperature variation may be different than that shown.

To compensate for the temperature variation introduced into Vx, the compensation signal, shown by plot 316, is output from the calibration DAC. The compensation signal is an analog representation of the digital compensation signal from the look-up table. The compensation signal plot 316 inversely mirrors the signal plot for Vx and as such compensate for the temperature induced error in Vx. As shown in FIG. 2, the compensation signal and Vx, based on the main DAC output, is summed by summing junction 265 (FIG. 2) to create a compensated signal shown by plot 320. Plot 320 does not vary over temperature. The compensated signal is presented as the second input to the comparator 108 (FIG. 2).

Figure 4:
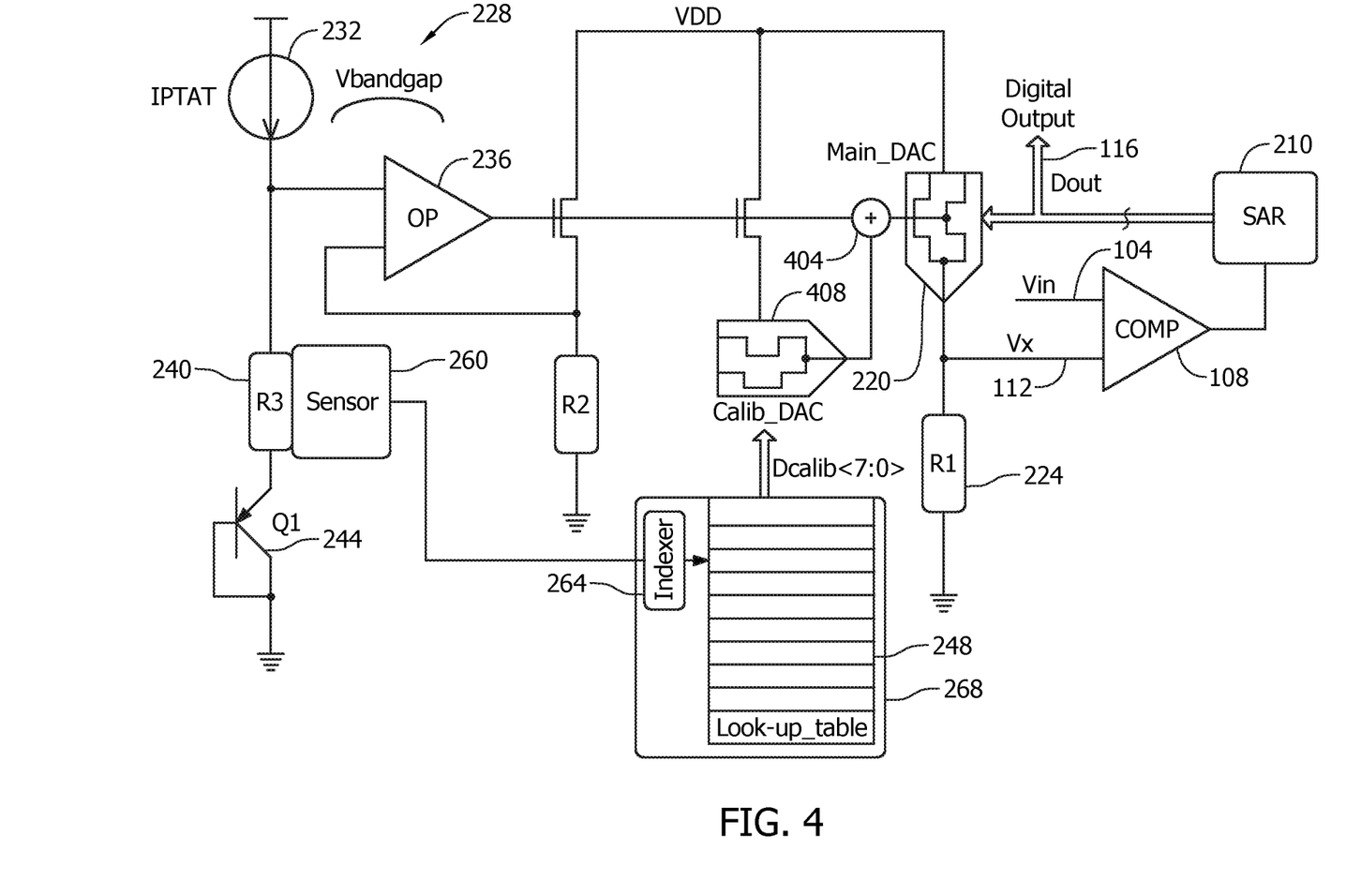
FIG. 4 illustrates an alternative embodiment which compensates the bias signal to a main DAC.

Furthermore, although shown as providing a compensation signal to the output of the main DAC 220, it is contemplated the bias signal, which compensates Vx directly, could instead be used to compensate the main DAC bias signal. FIG. 4 illustrates an alternative embodiment which compensates the bias signal to the main DAC 220. As such, the output of the look-up table 268 is provided to a calibration DAC 408 which generates a bias compensated signal that is provided to a summing junction 404 to inversely compensate the main DAC bias signal proportional to temperature induced error in the main DAC bias signal. It is also within the scope of the innovation to compensate the bandgap voltage 228.

It is also contemplated that although shown with a SAR based ADC, the temperature compensation method and system may be implemented with any type of ADC that suffers from gain error induced by temperature variation, or other error due to change in temperature. For example, this method and apparatus may be enabled with switch capacitor ADC, delta-sigma ADC, dual slope ADC, pipelined ADC, flash ADC, or any other type of ADC configuration.

Figure 5:
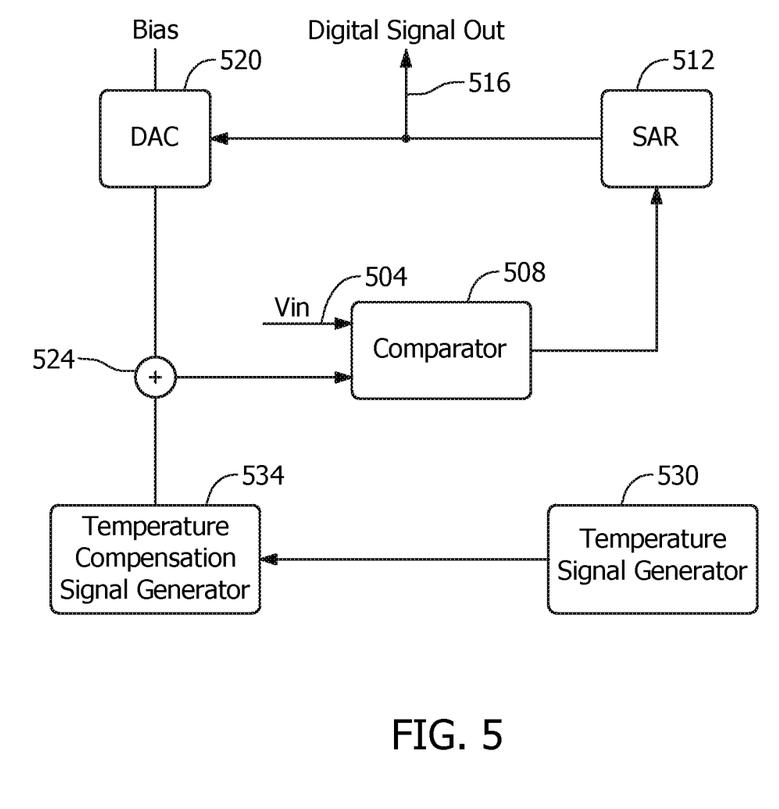
FIG. 5 illustrates a block diagram of an alternative embodiment of the temperature compensation system.

FIG. 5 illustrates a block diagram of an alternative embodiment of the temperature compensation system. Other possible embodiments are contemplated. The input signal Vin 504 is provided to the comparator 508, which also receives a second input from a summing junction 524 as shown. The output of the comparator 508 is provided to a SAR 512 which generates a digital output signal presented on output 516. The digital output signal is also provided to a DAC 520. The DAC 520 converts the digital signal to an analog signal which is provided to the summing junction 524. The output of the DAC 520 may be affected by temperature, which introduces error into the DAC output.

The summing junction 524 also receives a compensation signal from a temperature compensation signal generator 534. The temperature compensation signal generator 534 receives an input from a temperature signal generator 530. The temperature signal generator 530 generates a signal that is proportional to, represents temperature or otherwise varies with temperature. The temperature compensation signal generator 534 processes the signal from the temperature signal generator 530 to generate a compensation signal. The compensation is inverse to the temperature induced error in the output signal from the DAC 520 to thereby reverse or compensate for error in the DAC output 520.

Figure 6:
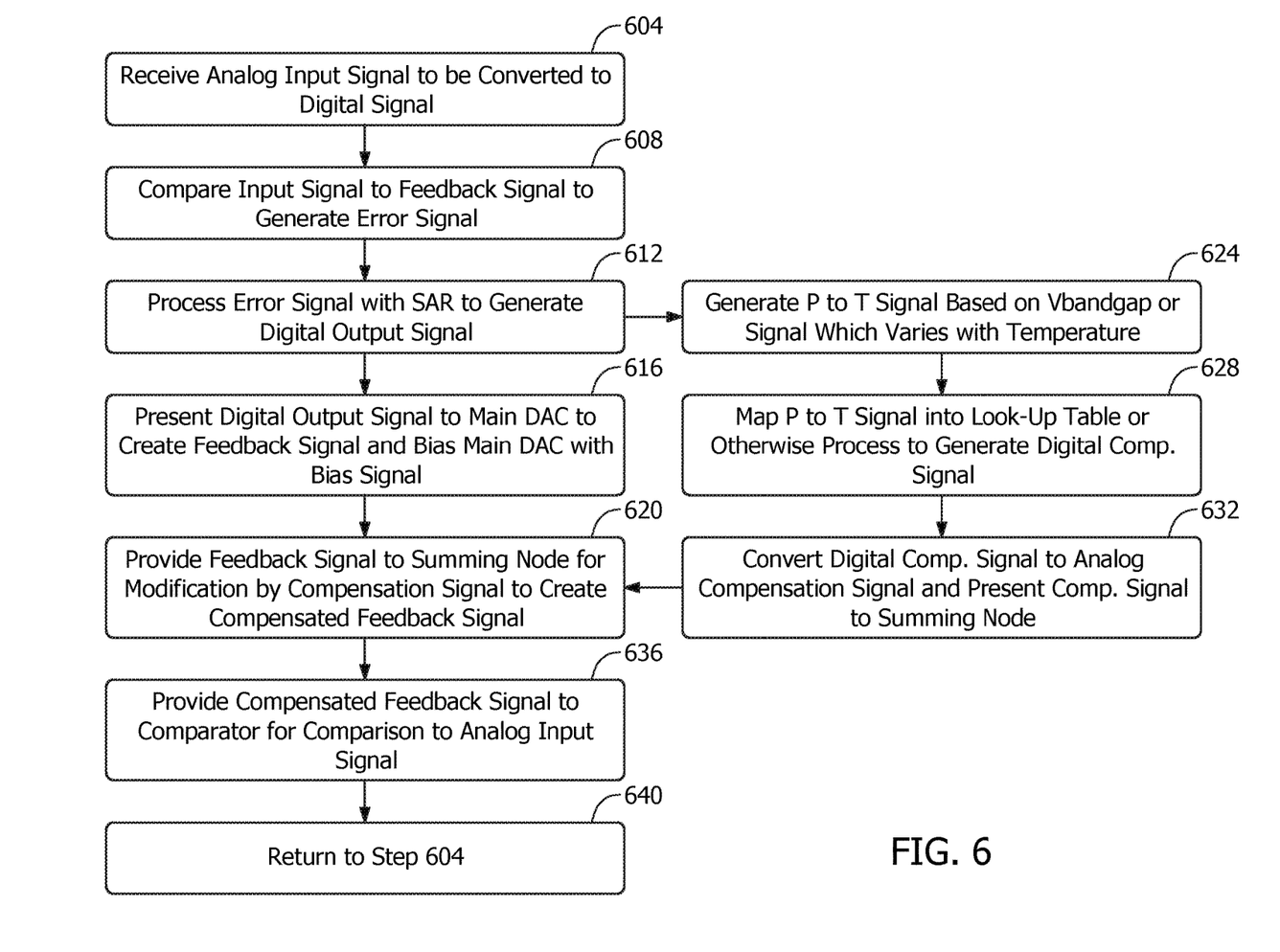
FIG. 6 illustrates an example method of operation of the temperature compensation circuit of FIG. 2.

FIG. 6 illustrates an example method of operation of the temperature compensation circuit of FIG. 2. This is but one possible method of operation and, based on the various embodiments disclosed herein, there are other methods of operation which do not depart from the claims of the scope of the innovation. At a step 604, the ADC receives an analog input signal which is to be converted to a digital signal by the ADC. At a step 608, a comparator or other device compares the input signal to a feedback signal to generate an error signal. The feedback signal is or is related to the digital output signal described herein.

At a step 612 the error signal is processed, such that in one embodiment a SAR, generates a digital output signal. The digital output signal is output from the ADC as part of the analog to digital conversion. The path from step 612 branches to a step 624 and a step 616. Continuing at step 616, the digital output signal is fed back to a main DAC to be used to create the feedback signal. The main DAC is biased with a bias signal, which as described above, is affected by changes in temperature which introduces error in the feedback signal. At a step 620 the system provides the feedback signal to a summing node for modification by a compensation signal to create a compensated feedback signal.

Turning to step 624, the system generates a proportional to temperature (PtoT) signal based on the Vbandgap voltage or a signal which varies with temperature. It is contemplated that this PtoT should vary in a way which varies over temperatures in a way which can be related to the temperature variation in the bias signal provided to the main DAC. At a step 628, a mapping or translation of the PtoT signal into a look-up table or other device to generate a digital compensation signal. The look-up table may include memory which can be indexed or accessed based on the PtoT signal to obtain the compensation signal. Look-up table operation is known by those of ordinary skill in the art and as such it not described herein. Next, at a step 632, the digital compensation signal is converted to an analog compensation signal and presented to the summing node. This method of operation then returns to step 620 such that the compensation signal is combined with the feedback signal to create the compensated feedback signal.

At a step 636 the compensated feedback signal is provided to the comparator for processing by the comparator along with the analog input signal. Thereafter, at a step 640, the operation returns to step 640, and the operation continues with the feedbacks signal provided to the comparator being temperature compensated.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. An analog to digital converter temperature compensation system comprising:
    a comparator configured to compare an analog input signal to a compensated feedback signal and generate a comparator output;
    a SAR module configured to process the comparator output to generate a digital signal;
    a digital to analog converter, biased by a biasing signal having temperature change induced error, configured to convert the digital signal to a feedback signal;
    a detector configured to detect a signal that is proportional to temperature;
    a look-up table configured to receive and convert the signal that is proportional to temperature to a compensation signal such that the compensation signal compensates for the temperature change induced error in the biasing signal; and a summing node configured to combine the feedback signal with the compensation signal to create a compensated feedback signal.

2. The system of claim 1 wherein the bias signal is based on a bandgap voltage which varies over temperatures.

3. The system of claim 1 wherein the detector comprises a voltage detector that detects a voltage that varies with a bandgap voltage.

4. The system of claim 1 wherein further comprising a calibration digital to analog converter configured to convert the output of the look-up table to an analog for summing with the feedback signal.

5. A method for compensating gain error in an analog to digital converter comprising: receiving an analog input signal for conversion to a digital signal;

processing the analog input signal and a compensated feedback signal to generate the digital signal such that as part of the processing a feedback signal is created;

detecting a temperature proportional voltage which varies proportional to temperature;

converting the proportional voltage to a compensation signal; and combining the compensation signal with the feedback signal to generate a compensated feedback signal, the compensation signal reversing error in the feedback signal due to the feedback signal varying over temperature.

6. The method of claim 5 wherein converting comprising performing a look-up table indexing operation to retrieve a stored value that is correlated to the proportional voltage.

7. The method of claim 5 wherein the method occurs in a SAR type ADC and the processing further comprises:

comparing the compensated feedback signal to the analog input signal to generate an error signal;

processing the error signal with a SAR module to generate the digital signal.

8. The method of claim 5 wherein detecting a temperature proportional voltage is performed by an analog voltage buffer and low accuracy temperature digitizer.

9. The method of claim 5 wherein the feedback signal is influenced by a bandgap signal which varies over temperature.

10. The method of claim 9 wherein the feedback signal is generated by a main digital to analog converter.

11. The method of claim 10 wherein the main digital to analog converter is biased by a bias signal that varies with temperature which introduced error into the feedback signal.

12. A compensation system to correct error introduced in an analog to digital converter output caused by changes in temperature over time comprising:

a voltage detector configured to detect a temperature proportional voltage; the temperature proportional voltage varies with temperature;

a look-up table configured map the temperature proportional voltage to a compensation value and output the compensation value; and a summing junction configured to combine the compensation value with a feedback signal, to create a compensated comparator input, to counter error in the comparator input.

13. The system of claim 12 further comprising a comparator configured to compare the compensated comparator input to an analog input signal to generate a comparator output and SAR module configured process the comparator output into a digital signal.

14. The system of claim 12 further comprising a main digital to analog converter configured to generate the feedback signal, the main digital to analog introducing error into the feedback signal due to temperature change induced error.

15. The system of claim 14 wherein the main digital to analog converter is biased by a bias signal and the bias signal varies over temperature thereby introducing error into the feedback signal.

16. The system of claim 12 further comprising a compensation digital to analog converter configured to convert the compensation value from the look-up table to an analog format.

17. The system of claim 12 wherein the voltage detector comprises an analog voltage buffer and low accuracy temperature digitizer.

18. The system of claim 12 wherein analog to digital converter includes a successive approximation register module.

* * * * *